(12) United States Patent
Suorsa

(10) Patent No.: US 10,085,370 B2
(45) Date of Patent: Sep. 25, 2018

(54) POWDER COATING METHOD AND APPARATUS FOR ABSORBING ELECTROMAGNETIC INTERFERENCE (EMI)

(71) Applicant: Flextronics AP, LLC, Broomfield, CO (US)

(72) Inventor: Peter Suorsa, Amesbury, MA (US)

(73) Assignee: Flextronics AP, LLC., San Jose, CA (US)

( * ) Notice: Subject to any disclaimer, the term of this patent is extended or adjusted under 35 U.S.C. 154(b) by 0 days.

(21) Appl. No.: 14/216,800

(22) Filed: Mar. 17, 2014

(65) Prior Publication Data

US 2014/0264182 A1    Sep. 18, 2014

Related U.S. Application Data

(60) Provisional application No. 61/791,098, filed on Mar. 15, 2013.

(51) Int. Cl.
| | |
|---|---|
| *H05K 9/00* | (2006.01) |
| *H01Q 17/00* | (2006.01) |
| *H05K 1/02* | (2006.01) |

(52) U.S. Cl.
CPC .......... *H05K 9/0088* (2013.01); *H01Q 17/00* (2013.01); *H01Q 17/002* (2013.01);
(Continued)

(58) Field of Classification Search
CPC ............ G21F 1/10; G21F 1/103; G21F 1/106; H05K 9/0088; H05K 1/0236;
(Continued)

(56) References Cited

U.S. PATENT DOCUMENTS 3,255,052 A * 6/1966 Opitz ............................ 148/105
3,599,210 A   8/1971 Stander
(Continued)

FOREIGN PATENT DOCUMENTS

| CN | 101005730 A | 7/2007 |
|---|---|---|
| CN | 101704312 A | 5/2010 |

(Continued)

OTHER PUBLICATIONS

Arnold et al., "A New Magnetic Material of Very High Permeability," Bell System Technical Journal, 2: 3., Permalloy, pp. 101-111 (Jul. 1923).
(Continued)

*Primary Examiner* — Peter F Godenschwager
*Assistant Examiner* — Andrew J. Oyer
(74) *Attorney, Agent, or Firm* — Volpe and Koenig, P.C.

(57) ABSTRACT

A method for producing a magnetic resonant frequency (MRF) absorber and apparatus for an MRF absorber are described herein. The method comprises processing a high permeability material such as permalloy comprising 80% nickel, 18% iron, 2% molybdenum to create a specific geometric form factor such as a flake, sphere, or rod. The geometric form factor may then be encapsulated in an insulating matrix. The insulating matrix may be a Potassium Silicate ($SiO_3K_2$). The insulated flake, sphere, or rod form factor may be introduced to a powder coating process. The insulated flake, sphere, or rod form factor may then be mixed with a polymeric coating powder at a weight ratio based on a desired performance for absorbing electromagnetic interference (EMI).

15 Claims, 3 Drawing Sheets

(52) U.S. Cl.
CPC ..... *H05K 1/0236* (2013.01); *G02B 2207/121* (2013.01); *H05K 1/024* (2013.01); *H05K 1/0233* (2013.01); *H05K 2201/083* (2013.01); *Y10T 29/49018* (2015.01); *Y10T 156/1002* (2015.01)

(58) Field of Classification Search
CPC ........... H05K 1/0233; H05K 2201/083; H05K 1/024; H01Q 17/002; H01Q 17/00; Y10T 156/1002; Y10T 29/49018
USPC ........ 341/1; 29/601; 156/182, 196; 252/478; 427/202; 250/515.1; 342/1, 2, 3, 4
See application file for complete search history.

(56) References Cited

U.S. PATENT DOCUMENTS

| | | | |
|---|---|---|---|
| 3,733,606 A | | 5/1973 | Johansson |
| 4,162,496 A | | 7/1979 | Downen et al. |
| 4,490,283 A | * | 12/1984 | Kleiner ............... B29C 47/0004 252/512 |
| 4,846,699 A | | 7/1989 | Glover et al. |
| 5,187,220 A | | 2/1993 | Richart et al. |
| 5,202,535 A | | 4/1993 | Dauwen et al. |
| 5,229,773 A | | 7/1993 | Dauwen et al. |
| 5,258,596 A | | 11/1993 | Fabish et al. |
| 5,545,474 A | | 8/1996 | Podlaseck et al. |
| 5,656,081 A | | 8/1997 | Isen et al. |
| 5,786,785 A | | 7/1998 | Gindrup et al. |
| 5,872,534 A | | 2/1999 | Mayer |
| 6,225,939 B1 | | 5/2001 | Lind |
| 6,486,822 B1 | * | 11/2002 | Peterman .......................... 342/1 |
| 6,538,596 B1 | | 3/2003 | Gilbert |
| 6,756,932 B1 | | 6/2004 | Barker et al. |
| 7,256,753 B2 | | 8/2007 | Werner et al. |
| 7,719,477 B1 | | 5/2010 | Sievenpiper |
| 7,750,869 B2 | | 7/2010 | Mosallaei |
| 8,013,777 B2 | | 9/2011 | Sim et al. |
| 8,063,116 B2 | * | 11/2011 | Trogolo et al. ............... 523/122 |
| 8,164,506 B2 | | 4/2012 | Sim et al. |
| 8,179,298 B2 | | 5/2012 | Sim |
| 8,674,792 B2 | | 3/2014 | Yonak et al. |
| 2003/0219598 A1 | * | 11/2003 | Sakurai .......................... 428/403 |
| 2004/0112403 A1 | * | 6/2004 | Lewis, III ............. B08B 7/0035 134/1 |
| 2004/0140945 A1 | | 7/2004 | Werner et al. |
| 2004/0169616 A1 | | 9/2004 | Schultz et al. |
| 2006/0150902 A1 | * | 7/2006 | Stelter .................... G03G 5/144 118/621 |
| 2007/0251444 A1 | * | 11/2007 | Gros-Jean ............. C23C 16/345 117/92 |
| 2009/0226673 A1 | | 9/2009 | Friedersdorf et al. |
| 2011/0026234 A1 | | 2/2011 | Kim et al. |
| 2011/0287218 A1 | | 11/2011 | Narimanov |
| 2012/0003844 A1 | | 1/2012 | Kumar et al. |
| 2012/0062346 A1 | | 3/2012 | McKinzie, III |
| 2012/0169525 A1 | | 7/2012 | Klar et al. |
| 2012/0228563 A1 | | 9/2012 | Fuller et al. |
| 2012/0235848 A1 | | 9/2012 | Bruno et al. |
| 2013/0063296 A1 | | 3/2013 | Hennig et al. |
| 2013/0257639 A1 | * | 10/2013 | Takahashi et al. ............... 342/1 |
| 2014/0266849 A1 | | 9/2014 | Suorsa |
| 2014/0266850 A1 | | 9/2014 | Suorsa |

FOREIGN PATENT DOCUMENTS

| | | |
|---|---|---|
| CN | 102480035 A | 5/2012 |
| CN | 102529229 A | 7/2012 |
| CN | 102544668 A | 7/2012 |
| CN | 102683831 A | 9/2012 |
| CN | 102751582 A | 10/2012 |
| CN | 102752995 A | 10/2012 |
| CN | 102800943 A | 11/2012 |
| CN | 102856663 A | 1/2013 |
| EP | 1077507 | 2/2001 |
| EP | 2518823 | 10/2012 |
| TK | 2010/109174 | 9/2010 |
| TK | 12142831 A1 | 10/2012 |
| WO | 2001/95347 | 12/2001 |
| WO | 2012/142831 | 10/2012 |
| WO | 12142830 A1 | 10/2012 |

OTHER PUBLICATIONS

Crnojevic-Bengin et al., "Fractal Geometries of Complementary Split-Ring Resonators," IEEE Transactions on Microwave Theory and Techniques, vol. 56, No. 10 (2008).
Euro Technologies, "Microwave Absorbing Materials—Introduction to Microwave Absorbers," pp. 3-6, (2004).
Gu et al., "A Broadband Low-Reflection Metamaterial Absorber," Journal of Applied Physics, 108, 064913 (2010).
Gupta et al., "Effect of Annealing Temperature on the Magnetic Behavior of Ni-Rich Permalloy Magnetic Materials," Indian Journal of Engineering and Materials Sciences, vol. 12, pp. 577-585 (Dec. 2005).
IEEE Standard for Information technology—Telecommunications and information exchange between systems—Local and metropolitan area networks—Specific requirements; Part 11: Wireless LAN Medium Access Control (MAC) and Physical Layer (PHY) Specifications, IEEE Std. 802. 11-2012 (Mar. 29, 2012).
Jaumann Absorber. In *Wikipedia*. Retrieved May 13, 2016, from http://wikipedia.org/wiki/Jaumann_absorber.
Kafesaki et al., "Left-handed metamaterials: The fishnet structure and its variations," Physical Review B 75, 235114 (2007).
Kwak et al., "Design of Multilayer PIFA Based on an EBG Structure for SAR Reduction in Mobile Applications," 2009 Asia Pacific Microwave Conference, pp. 645-648, Singapore (2009).
Landy et al., "A Perfect Metamaterial Absorber," Physical Review Letters 100, No. 20 (2008).
Ramahi et al., "Metamaterials: An Enabling Technology for Wireless Communications," Electrical and Computer Engineering Department, University of Waterloo, (2009).
Salisbury Screen. In *Wikipedia*. Retrieved May 13, 2016, from http://en.wikipedia.org/wiki/Salisbury_screen.
Sandora, "Isolation Improvement with Electromagnetic Band Gap Surfaces," Lincoln Laboratory Journal pp. 51-61, vol. 19, No. 1 (2012).
Smith et al., "Composite Medium with Simultaneously Negative Permeability and Permittivity," Physical Review Letters, vol. 84, No. 18, pp. 4184-4187 (May 1, 2000).
Wang et al., "Effects of aspect ratio and particle size on the microwave properties of Fe—Cr—Si—Al alloy flakes," Materials Science and Engineering: A, pp. 178-182, (2007).
"B-Stage," http://www.arni.ac.uk/courses/topics/0211_pmp/solutions/sol_01.html, Available at: https://web.archive.org/web/20110913114027/http://www.arni.ac.uk/courses/topics/0211_pmp/solutions/sol_01.html (Sep. 13, 2011).
MG Chemicals, "Super Shield Nickel Conductive Coating," http://www.mgchemicals.com/products/protective-coatings/emi-rfi-shielding/super-shield-nickel-841, Available at: https://web.archive.org/web/20120923124458/http://www.mgchemicals.com/products/protective-coatings/emi-rfi-shielding/super-shield-nickel-841 (Sep. 23, 2012).
"South Bay Circuits Manufacturability Guidelines for Printed Circuit Boards," Available at: https://web.archive.org/web/20090204224845/http://scnbd.com/doc/2877555/PCB-Guide (Feb. 4, 2009).
Thermal Spray Technologies, Inc., "EMI/RFI Shielding Coatings," http://www.tstcoatings.com/EMI_RFI_shielding.html, Available at: https://web.archive.org/web/20120817023623/http://www.tstcoatings.com/EMI_RFI_shielding.html (Aug. 17, 2012).
Salisbury Screen, In Wikipedia, Sep. 13, 2006, Retrieved Aug. 18, 2017 from https://web.archive.org/web/20060913000000/https://en.wikipedia.org/wiki/Salisbury_screen.

* cited by examiner

POWDER COATING METHOD AND APPARATUS FOR ABSORBING ELECTROMAGNETIC INTERFERENCE (EMI)

CROSS REFERENCE TO RELATED APPLICATIONS

This application claims the benefit of U.S. Provisional Application Ser. No. 61/791,098 filed Mar. 15, 2013, the contents of which are hereby incorporated by reference herein.

BACKGROUND

As technology continues to progress and more and more electronic devices become increasingly common in all industries, the focus on Electromagnetic Interference (EMI) becomes immensely important. Electromagnetic Interference, also known as radio-frequency interference (RFI), is a disturbance that may affect an electrical circuit due to either the electromagnetic induction or radiation emitted from an external source. The external source may be either artificial or natural, making this an extremely hard problem to resolve due to the large amount of variance that the EMI could be sourced from. Devices such as cell phones, tablets, and computers are some of the main emitters of EMI. Electronics such as these could eventually lead to the disruption, degrading, or interruption of the performance of circuits, render them useless, or destroy them completely through interference overload. Every electronic device emits a type of EMI that can be potentially harmful. Thus, the reason for why this problem must be addressed with new technology.

Any electrical or electronic device has the potential to generate conducted and radiated interference. Typical sources of conducted interference may include switching power supplies, alternating current (AC) motors, microwave ovens and microprocessors.

EMI generates unwanted signals from a first circuit, (e.g., a radio, computer chip, computer board, and the like), that may be picked up by a second circuit. This may cause the second circuit to operate less efficiently than desired. In the simplest cases, the second circuit may have "glitches" in its operations, although this may extend to the second circuit yielding incorrect data.

Typically, EMI has been contained at the "box" level of a device, (as dictated by government health and environmental safety regulations), or at best with grounded shielding around a specific component or set of components. In its most extreme form, (i.e., high security/cryptographic environments), the entire device may be enclosed within a shielded room.

Despite there being many types of absorbers, all work through a process of converting unwanted electrical and magnetic emissions into small amounts of heat. The "absorption" strategy is one of attenuation and differs with "shielding" which may be viewed as a strategy of isolation, in that it utilizes conductive material to contain EMI by reflecting the unwanted emissions back towards their source.

Some of the metalized products used by the electronics industry to shield and contain EMI include; metalized gaskets, conductive coatings, shielding tapes, finger stock and an array of ferrite products including beads, toroids, chokes and inductors.

It is quickly becoming apparent that as clock speeds continue to increase, the frequencies emitted will also climb. This will make EMI management an ever-increasing problem. Traditional shielding methods such as finger stock, fabric-over-foam, and board-level shields will prove to be increasingly less effective in these environments. Ironically, it is often these traditional materials that contribute to the resonance problem. They provide a conductive path for energy, which in turn keeps the energy inside the cavity. This contained energy may adversely affect other components on the board and may keep the board from functioning properly. Apart from containment related problems, traditional reflective type shielding technologies simply can no longer hold the waveform . . . it is simply too small at these higher frequencies.

The damaging effects of electromagnetic interference may pose unacceptable risks in many areas of technology, and it is desirable to control such interference and reduce the risks to acceptable levels.

SUMMARY

A method for producing a magnetic resonant frequency (MRF) absorber and apparatus for an MRF absorber are described herein. The method comprises processing a high permeability material such as permalloy comprising 80% nickel, 18% iron, 2% molybdenum to create a specific geometric form factor such as a flake, sphere, or rod. The geometric form factor may then be encapsulated in an insulating matrix. The insulating matrix may be a Potassium Silicate ($SiO_3K_2$). The insulated flake, sphere, or rod form factor may be introduced to a powder coating process. The insulated flake, sphere, or rod form factor may then be mixed with a polymeric coating powder at a weight ratio based on a desired performance for absorbing electromagnetic interference (EMI).

BRIEF DESCRIPTION OF THE DRAWINGS

A more detailed understanding may be had from the following description, given by way of example in conjunction with the accompanying drawings wherein.

DETAILED DESCRIPTION

Methods and apparatuses are described herein that leverage the advantageous physical attributes and process parameters of powder coating when applied to the creation of magnetic resonant frequency (MRF) absorber material.

Magnetic material, (e.g., permalloy, mu-metal, and the like), may be transformed into a physical format that will work with the appropriate binder and be used in any of the embodiments described herein. Typically, the magnetic material may be processed into a sphere, rod, or flake from the bulk metal. Magnetic materials geometry used in absorbers may indicate that the flake geometric form factor has distinct advantages over other geometries in building successful absorbers. Additionally, the aspect ratio of the material in any geometry may be critical to attaining the maximum permittivity and permeability. This has been attributed, among other things, to the increase of the magnetic moment coupling that increases with surface area. Additionally, the milling process that is used to create the flake may also increase the coercivity, which was attributed to the disordered crystal structure caused by the physical process.

Once the conversion has been completed, the material may be annealed to restore or enhance the permeability. Presumably, the annealing step may restore the coercivity to normal values. This may occur by re-orienting the crystal structure of the material for a permalloy material to create a NiFe$_3$ superlattice structure. Similar effects may occur with other magnetic materials.

Figure 1:
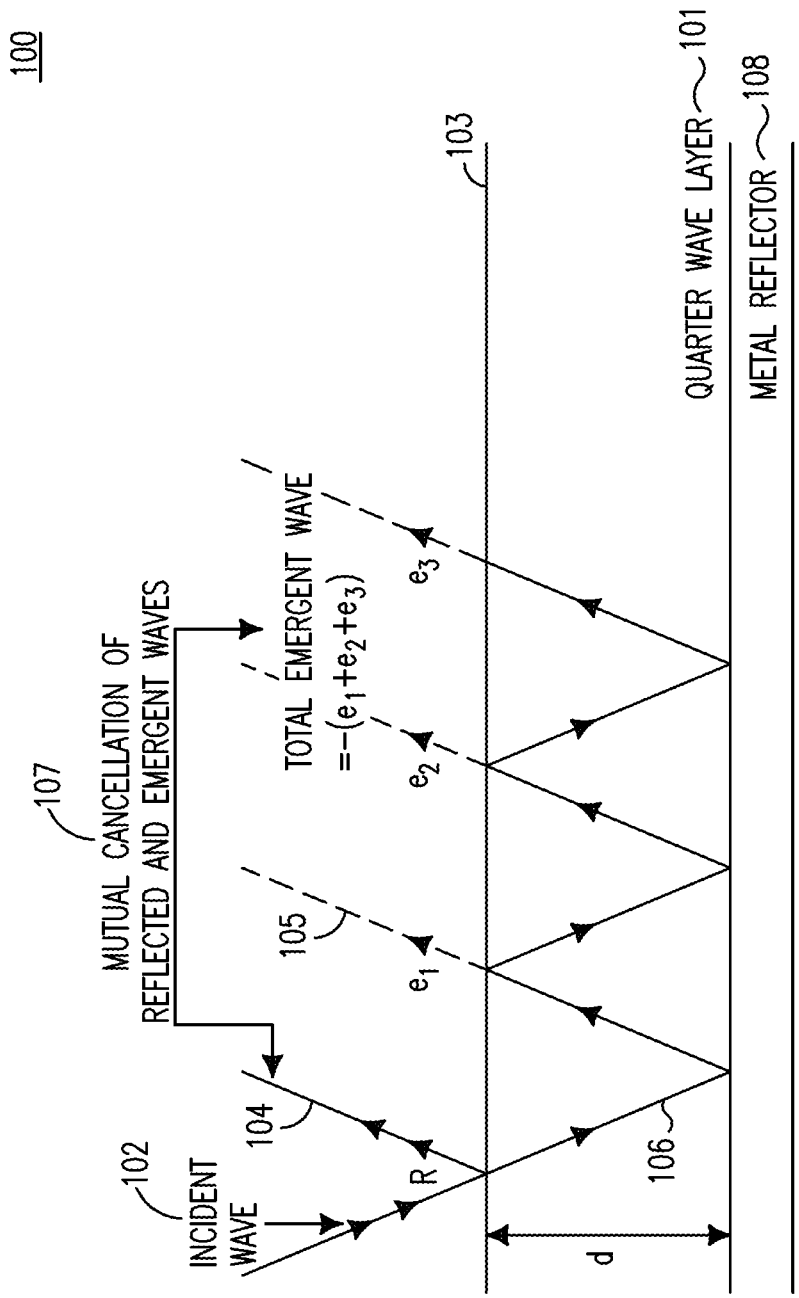
FIG. 1 is an example of the method by which a magnetic resonant frequency (MRF) absorber operates when an out-of-phase condition exists between reflected and emergent waves.

FIG. 1 is an example of the method by which a magnetic resonant frequency (MRF) absorber 100 operates when an out-of-phase condition exists between reflected and emergent waves. For an ideal absorber, (i.e., theoretical maximum absorption), the thickness of the absorber may be one-quarter (¼) of the wavelength 101 of the incident wave 102, whereby part of the incident wave 102 may be reflected 104 from the "air/absorber" boundary 103, and the remaining portion of the incident wave being reflected 106 from the metal conductive reflector 108 surface within the absorber. The reflected wave and emergent wave 105 mutually cancel 107 as a result.

Figure 2:
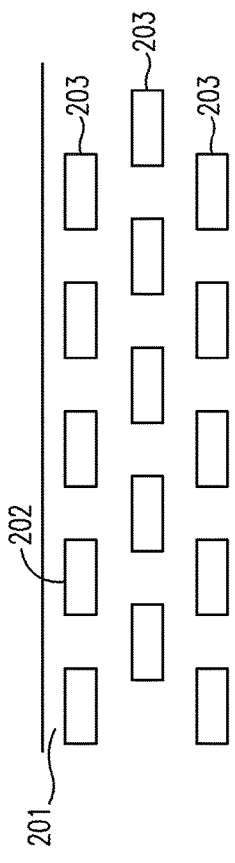
FIG. 2 is an example of stacked "flakes" within an alchemic thin sheet absorber (TSA)

FIG. 2 is an example of stacked "flakes" within an alchemic thin sheet absorber (TSA) 200. The metallic component of the absorber is composed of permalloy flakes 202 so that the dielectric/metal boundary may occur in the first several atom layers of the TSA flake. The TSA may actually be considerably thicker than the thickness dimension of the flake, which may allow multiple layers of flakes 203 to be stacked within the TSA. This may result in multiple incident waves being intercepted resulting in the integration of out-of-phase reflections over the totality of flakes within the TSA combined with the integration of the reflections from the air/dielectric boundary, which may result in the wave being absorbed.

In another embodiment, resonant absorbers produced with "flake" embedded into a dielectric may typically be tuned to a single frequency for maximum attenuation. Multiple frequencies capability may be achieved by changing the physical properties of the film, as well as by including more than one dielectric.

In another embodiment, an alternative annealing process that uses a high temperature or ultra high temperature ceramic may encapsulate the individual component into a thermal shield prior to annealing. Polymorphic Si or SiC may be the materials of choice for this type of high temperature insulator. Alternatively, more exotic materials such as Nitrides of transition metals may be used.

For example, the above described methods may be implemented to build a workable absorber material for a 2.4 GHz application area. Different geometries and aspect ratios may allow different frequency domains to be addressed. Besides merely building an absorber material, the absorber material may be directly incorporated form factors including but not limited to the following printed circuit board (PCB) interlayers, PCB card guides, cables, injection molded parts, wall coverings, powder coated assemblies and or parts, adhesive absorber sheet material.

If one looks at the wavelengths for incident radiation, (e.g., WiFi @2.4 GHz), the "free air" wavelength may be approximately 124 mm, which may result in an extremely thick coating on a product. This thickness may be reduced by inserting the magnetic material into a matrix, (with a known dielectric constant), whereupon the same absorption may be obtained with a material that is $1/\mu\varepsilon$. This takes into account the "stacked flakes" effect.

It may also be possible to use powder coat technology to apply the flake/dielectric directly to the surface of a product, such as an automobile or panels that are used to create a "screen room" for environments that must be protected from unwanted electromagnetic emissions for reasons including but not limited to the following: EMC regulations, ensuring integrity of device functionality, or selective blocking and reception of specific frequencies. Additionally, direct coating of surfaces used for electronics racks may greatly reduce the complexity and cost of making these kinds of installations compliant with various environmental regulations.

Powder coating is an industrial process whereby dry powder is applied to a conductive part via an electrostatic gun or a fluidized bed. The powder takes on a charge, and sticks to the part, which has been electrically grounded. The charged powder particles adhere to the parts and may be held there until melted and fused into a smooth coating in a curing oven. Before coating, the parts to be coated may first be pretreated similarly to conventional liquid coated parts. The pretreatment process may be conducted in series with the coating and curing operations. The part is then baked in an oven at approximately 200 degrees Celsius for 10-20 minutes. The powder, which may be made up of a mixture of thermoset polymer resins, fillers, pigments and other additives, may be melted onto the product and undergo a process of cross-linking, which hardens it, makes it resistant to damage, and also prevents it from re-melting. This process may be used as a cost-effective way to paint metal parts and provide a durable, attractive surface of various colors and sheens. It is also better for the environment, because the powders contain no volatile organic compounds (VOCs) and because the process yields very little waste, as any powder that fails to apply to a part can be reused.

Powder Coatings, in general, may contain a mixture of polymers, hardeners, fillers, pigments, and additives. As an example, one formulation may contains 50% resin/polymer, 4% hardener, 1% catalyst, 40% filler, 1% pigment and 4% additives. The powder coat polymer powders may have an overall distribution size between 2 and 100 microns, with the peak of the distribution at 30 or 40 microns. Examples of fillers that are regularly added to powder coat, and their average sizes, may be Wollastanite at 7 microns, Calcium Carbonate at 3 microns, and Clay at 1 micron. Additionally, ceramic microspheres (1-38 microns) may be added as fillers.

A powder coat MRF absorber may be implemented in accordance with one embodiment. The uniformity and durability of powder coated finishes, in addition to the ability to control surface texture, make powder coating a well suited process for powder coating of magnetic resonant frequency absorber materials. By controlling the size and aspect ratio of high permeability materials, (flake, rod, sphere, and the like), and additionally insulating the individual high permeability particles, these fillers may then be coated with traditional powder coat polymer. The ratio of powder coat polymer encapsulating the high permeability aggregate may be relatively high, but vary in accordance with the dielectric constant of the coat polymer chosen. Typically, the filler loading is in the 70% to 80% range (by weight).

The powder coating process is used extensively in industry to coat electronic enclosures including but not limited to wire and cable, components, automobiles, architectural products, and appliances. Powder coatings have been shown to possess significant durability and resistance to abrasion, corrosion, scratching, and chemicals when compared to liquid coatings. Thick coatings may be achieved quickly and efficiently. Powder coatings may maximize production, cut costs, improve efficiencies, and offer maximum compliance with increasing stringent environmental regulations, which may all reduce costs for the end user.

Described herein is a method for minimizing EMI in applications where EMI is a concern or problem and powder coating is the method for coating/painting. Proposed is a process that combines the following: (1) proven processes associated with all forms of powder coating and (2) the raw materials and disciplines that may create magnetic resonant frequency absorber material.

Powder coating may be applied using methods including but not limited to the following: (1) electrostatic spray, (2) fluidized bed, (3) electromagnetic brush (EMB). By maintaining all process parameters required of powder coat technology, little to no change in the process is required. Methodology may be dictated by the specific application. Since both processes support the ability to apply multiple layers, applications of frequency-specific absorber formulations may be applied, as well as alternative dielectric coatings and or materials that provide wave-scattering features. A multi-layer absorber may then provide multiple and or broadband attenuation. Another distinct benefit of powder coating absorber technology is its ability to provide thorough and uniform coverage. This process characteristic may ensure coverage that may be difficult to achieve with conventional spray painting methods.

Electrostatic spray powder coating may use a powder-air mixture from a small fluidized bed in a powder feed hopper. The feed hoppers may vibrate to help prevent clogging or clumping of powders prior to entry into the transport lines. The powder may be supplied by a hose to the spray gun, which has a charged electrode in the nozzle fed by a high voltage dc power.

Electrostatic powder spray guns may perform the following functions: (1) direct the flow of powder, (2) control the deposition rate, (3) control the pattern size, shape, and density of the spray, and (4) charge the powder being sprayed. The spray guns may be manual (hand-held) or automatic, fixed or reciprocating, and mounted on one or both sides of a conveyorized spray booth. Electrostatic spray powder coating operations may use collectors to reclaim over-spray. This reclaimed powder may then be reused, adding significantly to the powder coating's high transfer efficiency.

There are various gun designs that may differ in the method of applying electrostatic charge to the powder. The powder may be electrostatically charged by friction. In this case the powder may be free to deposit in an even layer over the entire surface of the part, and deposition into recesses may be improved.

Two methods for powder coating in a fluidized bed include but are not limited to an electrostatic process and an immersion process.

In the immersion fluidized bed process, the fluidized bed may have a tank with a porous bottom plate. The plenum below the porous plate may supply low pressure air uniformly across the plate. Rising air may surround and suspend the finely divided plastic powder particles, so the powder-air mixture resembles a boiling liquid. Products that are preheated (typically over 400 degrees F.) above the melt temperatures of the powder may be dipped in the fluidized bed, where the powder melts and fuses into a continuous coating. A high transfer efficiency results from little drag out and no dripping.

The fluidized bed powder coating method may be used to apply heavy coats in one dip, 3-10 mils (75-250 μm), uniformly to complex shaped products. It is possible to build a film thickness of 100 mils (2500 μm) using higher preheat temperatures and multiple dips.

Figure 3:
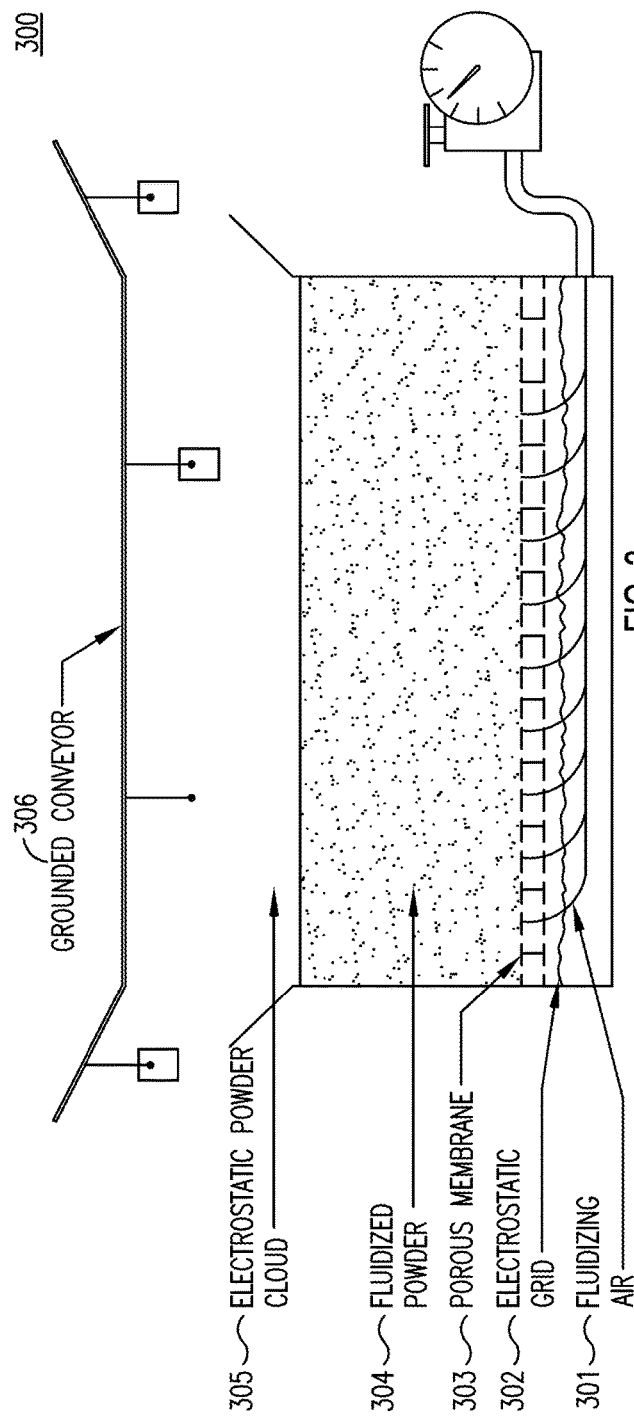
FIG. 3 is an example of an electrostatic fluidized bed.

FIG. 3 is an example of an electrostatic fluidized bed 300. Fluidized air 301 may be applied to the electrostatic fluidized bed. The electrostatic fluidized bed is essentially a fluidized bed with a high voltage dc electrostatic grid 302 installed above a porous membrane 303 to charge the finely divided fluidized powder particles 304. Once charged, the particles are repelled by the grid, and they repel each other, forming an electrostatic powder cloud 305 above the grid. These electrostatically charged particles are attracted to and coat products that are at ground potential, which may be located on a grounded conveyor 306. Film thicknesses may be similar to what may be achieved in the electrostatic spray process. Subsequent to the electrostatic coating of the part, a curing process (typically over 400 degrees F.) may be used to harden and thermally set the resin powder.

The advantages of electrostatic fluidized bed coating is that preheating of parts is generally not necessary and small products, such as electrical components, may be coated uniformly and quickly. The disadvantages are that the product size is limited and inside corners have low film thickness due to the Faraday cage effect.

The electromagnetic brush process may be similar to that used in photocopiers and laser printers, with "toner" particles triboelectrically charged against the ferromagnetic "carrier" particles, and transported with mixing rollers to a rotating shell or drum, which has stationary magnets within it. The ferromagnetic particles form a chain as directed by the magnetic field lines, also called a magnetic brush. The substrate becomes powder coated as it passes by the magnetic brush and the electrostatic field is turned on. Thicker layers may be achieved by passing the substrate by the magnetic brush more than once. Application areas may include the coating of coil, blanks, and even wood.

MRF absorbers operate via phase cancellation. The incoming wave incident upon the absorbing material is partially reflected and partially transmitted. The transmitted portion undergoes multiple internal reflections to give rise to a series of emergent waves. At the design frequency, the sum of the emergent waves is equal in amplitude to (by 180 degrees out of phase with) the initial refection portion. In theory, zero reflection takes place at the design frequency. In practice, absorption of >30 dB may be achieved. In the absorption process, RF energy is converted to heat.

Figure 4:
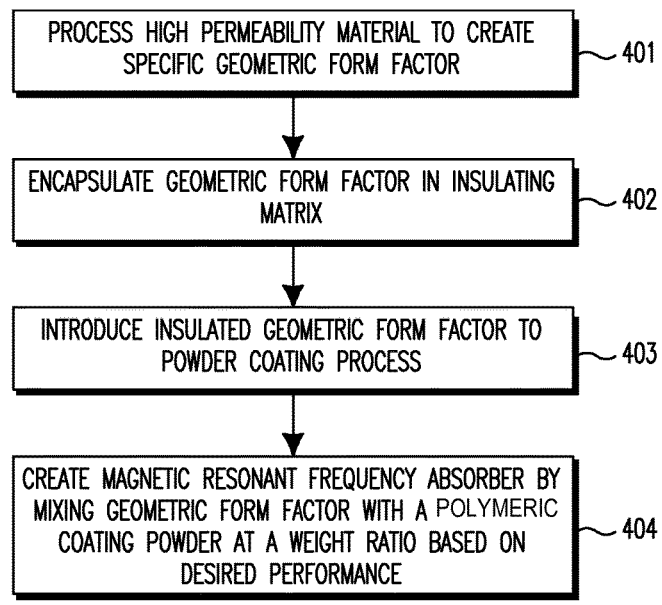
FIG. 4 is a flow chart of an example process by which high permeability metals may be processed to create a geometric form factor that supports the principles of MRF absorber design.

FIG. 4 is a flow chart of an example process 400 by which high permeability metals may be processed to create a geometric form factor that supports the principles of MRF absorber design. In the example of FIG. 4, high permeability material may be processed to create a specific geometric form factor 401. The geometric form factor may then be encapsulated in an insulating matrix 402. The encapsulated and insulated geometric form factor may then be introduced to a powder coating process 403. Then a magnetic frequency absorber may then be created by mixing the geometric form factor with a polymeric coating powder at a weight ratio chosen based on the desired performance 404.

The high permeability material used may be permalloy (80% nickel, 18% iron, 2% molybdenum) though other materials may be used including but not limited to other high permeability materials such as nanoperm, mu-metal, and various ferrite alloys.

As described above in the example of FIG. 4, the high permeability materials may be processed to create a specific geometry. For example, a "flake" form factor having a specific aspect ratio (60:1) is the preferred geometry used. Other form factors that may be used in the embodiments described herein include but are not limited to rod, sphere, and platelets. Each form factor may provide better attenuation at different frequencies. The aspect ratio may also be altered to provide improved attenuation at specific frequencies. In some instances, the process of creating a specific form factor may require a "cold working" of the raw material. This cold working may cause a reduction in the permeability inherent to the material. A subsequent annealing of the finished form factor may restore a good portion of the permeability that was lost.

As described above in the example of FIG. 4, the next step in the process is to encapsulate the individual "flake" (or any chosen high permeability particle) in an insulating matrix, such as Potassium Silicate ($SiO_3K_2$) that is produced by mixing an aqueous Potassium Silicate solution with the annealed "flakes". The Si=0 bond forms an attraction to the permalloy face centered cubic crystal structure, which may be extracted from the aqueous mixture. The silicate based insulation layer may ensure that the glass encapsulated "flake" is isolated electrically from other flakes, as well as ensuring that there are no adverse interactions with the binder. The insulated flake may ensure that the final absorber coating remains non-conductive.

As described above in the example of FIG. 4, the insulated "flake" may then be introduced to the powder coating process. Flake is also commonly used in the powder coating industry for cosmetic purposes i.e. glitter and shine. For all methods of powder coating, the proposed preparation of the high permeability material may be the same. One method of obtaining a metallic finish from a powder coating process is to admix metal flakes with the polymeric coating powder particulates. However, this process of admixing may result in inconsistent coatings.

In electrostatic coating, coating powder may be sprayed through a gun where a high voltage corona discharge may be used to establish an ionized field. As the powder particles pass through the ionized field, they become charged and are attracted to the substrate, which may be a grounded metallic article to be coated. The powder may then be fused to form a continuous film. In the spraying process, any powder which is not deposited on the substrate may be collected in a reclaim system and returned for admixture with the virgin material for reapplication. When metal flakes are merely admixed with the polymeric coating particulates, the flakes are not charged to the same extent or deposited at the same rate as the polymeric coating powder particulates. Over a period of time during which overspray is continuously reclaimed and admixed with virgin material, the metallic flake pigment may become more concentrated in the powder being sprayed, changing the appearance of the resulting finish from the finish which resulted from spray at the start of the run. Eventually, the higher concentration of metal flakes may interfere with the charging mechanism. If the powder in the ionized field becomes too conductive, the electrostatic gun may "short out".

In creating a MRF absorber, the ratio of hi-permeability material (flake) to coating powder (binder) may be critical to the final EMI absorptive characteristics. Due to the inconsistency of powder/flake ratios in this process or any of the aforementioned powder coating processes, simply admixing the two components may not be a viable option for creating a powder coat absorber. Any hi-permeability material, conductive or non-conductive, used in the creation of a MRF absorber may require that the flake, rod, sphere etc. be coated with the polymer powders at weight ratios suited to desired performance characteristics.

Adhering metallic and non-metallic flake to polymeric coating powder is also described herein. In the proposed creation of a powder coated MRF absorber, the flake, already having an insulative ceramic coating, may be mixed with exceptionally fine thermosetting resin particles (the paint coating component). These particles may range in size from less than 5 microns to 20 microns or more and have a specific dielectric constant that may be altered to change the performance characteristics of the MRF absorber.

The particular resins may be selected with softening temperatures sufficiently high to prevent the individual coating powder particulates from sintering or fusing during transportation and storage. The softening temperatures may be in the range of 85-160 degree Fahrenheit. Furthermore, the resin may have a melting temperature sufficiently low that it may be melt-compounded at a temperature well below a temperature where reactions between the resin and the cross-linking agent and/or cure catalyst results in substantial curing of the resin. For any particular resin type, the softening temperature and the melting point may be a function of the monomers present and molecular weight. Fillers, additional pigments, and other colorants, if used, may comprise up to about 50 wt. percent relative to the resin.

The thermosetting resin coating particulates may be produced in the using numerous methods. The components may be blended and then may be melt-compounded with heating above the melting point of the resin for a short time, e.g., 30-90 sec., so that no significant curing occurs. The molten compound may be extruded, and after extrusion, the composition may be rapidly cooled. The composition may then be ground and the particulates sorted according to size. Due to the exceptionally small size of the permalloy flake (30 micron diameter by 0.5 micron thickness on average), the particulate size of the thermosetting resin powders may be ground finer than the powders typically used in powder coating processes (<5 micron-20 micron on average). For electrostatic coating applications, the particulates may be generally in the 20-100 micron size range, more preferably, in the 20-40 micron size range.

The resin powders and insulated flake may be mixed at a ratio in keeping with optimized loading characteristics of proven MRF absorbers (80% flake 20% resin by weight). The amount by weight of flakes relative to the amount by weight of coating powder particulates may vary over a wide range in order to tune the MRF absorber's attenuation to specific frequencies.

In one example embodiment, the flake/resin mixture may be mixed using a rotating blade mixer. The admixture may be brought to a temperature that is in the range above the softening temperature of the thermosetting resin but below the melting point of the thermosetting resin. The mixing may be conducted with sufficient mechanical shear to prevent the agglomeration of the resin powder particulates and without degradation to the flake geometry. The mixing cycle may be complete when greater than 95% of the flake, by weight, is coated in the resin powder. The resin coated flake may then be brought to ambient temperature and is ready for deployment in any powder coating process.

It should be noted that specific temperatures, mixing times, shear forces, etc. may depend upon a number of factors, including but not limited to the composition of the particular thermosetting resin coating powder, the high permeability material, and the form factor. In addition to flake, conductive and non conductive form factors may be utilized in creating a MRF absorber, i.e. rods, spheres, cylinders of metallic and or polymeric compositions.

Any high permeability metallic flake having adhered thermosetting coating powders of desired weight ratios may be well suited for deployment in traditional spray and fluidized bed powder coating processes.

However, the electromagnetic brush (EMB) method poses a process hurdle for metallic flake processing. EMB technology may utilize a ferrite carrier bead that has been coated with resin powder as the deployment mechanism for coating. The tribo-electrostatically charged powder particles and ferrite carrier particles may be guided along a rotating drum containing magnets on a fixed static position. The powder particles may move to the substrate and carrier particles may remain on the drum by magnetic force. Given the magnetic nature of most high permeability metals used in MRF absorbers, the magnets, intrinsic to the EMB process, may prevent the high permeability material from being transferred to the substrate.

The electromagnetic brush process may, however, be well suited in applications where an all-dielectric absorber or metamaterial absorber is being created.

Metamaterials receive ever-increasing attention in the scientific community due to their unique physical properties and novel benefits. Metamaterials may be artificial media structured on a size scale smaller than the wavelength of external stimuli. Metamaterials may exhibit properties not found in nature, such as negative index of refraction. They comprise cellular assemblies of multiple elements fashioned from materials including metals and plastics, arranged in periodic patterns. Metamaterials may gain their properties not from their constituents, but from their exactingly designed structures. Their precise shape, geometry, size, orientation, and arrangement may affect light or sound in a manner that may be unachievable with conventional material Of particular importance to the application of powder coating MRF absorbers may be the negative permittivity and negative permeability of metamaterial over a given frequency range, thereby providing negative refraction (NR). This characteristic may provide a number of benefits in the proposed method for powder coating RF absorptive materials.

Many metamaterial designs may utilize metallic elements, which may be very lossy, may have very narrow bandwidth, may be anisotropic, may not be conformal, and may be almost impossible to realize for RF. The difficulty in maintaining periodicity and the large size structure required to achieve the desired performance may make these metamaterials unsuitable for deployment in powder coating applications.

A metamaterial constructed from readily-available dielectric and or magnetic materials is also described herein and is well suited for deployment in all powder coating processes. Formed as disks, rods, or spheres, the magnetic and dielectric components may be coupled in periodic or random fashion to allow tailored electric and magnetic dipole moments. Embedded in a polymer matrix, the coupled electric and magnetic components act as L (inductor) and C (capacitor) circuit models. Manipulation and arrangement of the L and C components in the polymer matrix allow control over the absorptive characteristics of the final coating.

In one example of a metamaterial based MRF absorber, the tailored electric particles represent the inductive side of the LC circuit model and may include a dielectric which is higher that the host matrix dielectric. The tailored magnetic particles may represent the capacitive side of the LC circuit model and have a dielectric which may be lower than the host matrix dielectric and may have a geometry that is different from the electric particles.

Control over the geometry differences of the electric and magnetic particles as well as control over their dielectric contrast to the host matrix, may allow low-loss, wideband performance in the powder coated absorber.

The method for adhering metallic and non-metallic flake to a polymeric powder coating may use the same method by which the customized electric and magnetic particles may be coated. The weight ratio of matrix powders to customized particles is easily controlled in the adhering process described herein.

The matrix coated particles of equal proportion may be homogeneously mixed for introduction to all powder coating methodologies. Whether through multiple passes, dwell time, or other process parameters of the powder coating process, thicknesses that allow sufficient electric and magnetic particles to be in close proximity to one another may be achieved and a metamaterial array may be created. Specifically, by controlling the matrix coating of the particles, one may create a "high loading" of the active components and may bring the components into closer proximity. This may enhance the bandwidth of the metamaterial permittivity and permeability properties.

In some instances, "tunable" materials may be used for one or both of the particle components. Choice in material allows the electric particles to be tuned with a DC electric bias and the magnetic particles to be tuned with a DC magnetic bias. The introduction of a DC magnetic field and or a DC electric field to the powder coating process equipment would allow the resonance frequency of the customized particles to be tuned for specific frequency response in situ.

Of particular importance may be the introduction of the non-conductive electric and magnetic particles that have received the adhering matrix powder, to the electromagnetic brush process. These all-dielectric particles may then be affixed to the ferrite carrier beads used in the EMB process. Processing of the particles may be the same for all powder coating processes; but for having created all-dielectric absorber components, these particles may then be compatible with an EMB coating method that relies on a ferrite carrier bead and high magnetics in the delivery system.

Although features and elements are described above in particular combinations, one of ordinary skill in the art will appreciate that each feature or element can be used alone or in any combination with the other features and elements. The methods and features described above may be performed using any appropriate architecture and/or computing environment. The apparatuses above may be controlled using any appropriate architecture and/or computing environment to perform a method herein. Although features and elements are described above in particular combinations, each feature or element can be used alone or in any combination with or without the other features and elements.

The references cited throughout this application are incorporated for all purposes apparent herein and in the references themselves as if each reference was fully set forth. For the sake of presentation, specific ones of these references are cited at particular locations herein. A citation of a reference at a particular location indicates a manner(s) in which the teachings of the reference are incorporated. However, a citation of a reference at a particular location does not limit the manner in which all of the teachings of the cited reference are incorporated for all purposes.

It is understood, therefore, that this disclosure is not limited to the particular embodiments disclosed, but is intended to cover all modifications which are within the spirit and scope of this disclosure as defined by the appended claims; the above description; and/or shown in the attached drawings.

What is claimed is:

1. A method for producing a magnetic resonant frequency (MRF) absorber, the method comprising:
processing a metamaterial, wherein the metamaterial is constructed from magnetic components and dielectric components having a first dielectric constant, wherein the magnetic components and dielectric components are arranged in a periodic pattern, to construct a geometric form factor with a 60:1 aspect ratio, wherein the geometric form factor is a flake;
encapsulating the geometric form factor constructed from the metamaterial in a Potassium Silicate ($SiO_3K_2$) matrix with a second dielectric constant, wherein the second dielectric constant is lower than the first dielectric constant; and
mixing the encapsulated geometric form factor constructed from the metamaterial with a thermosetting resin that is blended and melt-compounded at a temperature above the melting point of the resin, causing phase cancellation of reflected and emergent electromagnetic waves at frequencies based on the 60:1 aspect ratio.

2. The method of claim 1, wherein the mixing is performed by a rotating blade mixer.

3. The method of claim 1, further comprising:
mixing the encapsulated geometric form factor constructed from the metamaterial with a permeable material, wherein the permeable material is permalloy, wherein the permalloy comprises 80% nickel, 18% iron, 2% molybdenum.

4. The method of claim 1, wherein the mixing is at a weight ratio of 80% geometric form factor and 20% resin.

5. The method of claim 1, further comprising:
introducing the mixed encapsulated geometric form factor constructed from the metamaterial to an electromagnetic brush (EMB) process.

6. The method of claim 1, wherein negative permittivity and negative permeability of the metamaterial enable negative refraction over a given frequency range.

7. A magnetic resonant frequency (MRF) absorber prepared by a process comprising the steps of:
processing a metamaterial, wherein the metamaterial is constructed from magnetic components and dielectric components having a first dielectric constant, wherein the magnetic components and dielectric components are arranged in a periodic pattern, to construct a geometric form factor with a 60:1 aspect ratio, wherein the geometric form factor is a flake;
encapsulating the geometric form factor constructed from the metamaterial in a Potassium Silicate ($SiO_3K_2$) matrix with a second dielectric constant, wherein the second dielectric constant is lower than the first dielectric constant; and
mixing the encapsulated geometric form factor constructed from the metamaterial with a thermosetting resin that is blended and melt-compounded at a temperature above the melting point of the resin, causing phase cancellation of reflected and emergent electromagnetic waves at frequencies based on the 60:1 aspect ratio.

8. The MRF absorber of claim 7, wherein the mixing is performed by a rotating blade mixer.

9. The MRF absorber of claim 7, further comprising:
mixing the encapsulated geometric form factor constructed from the metamaterial with a permeable material, wherein the permeable material is permalloy, wherein the permalloy comprises 80% nickel, 18% iron, 2% molybdenum.

10. The MRF absorber of claim 7, further comprising:
introducing the mixed encapsulated geometric form factor constructed from the metamaterial to an electromagnetic brush (EMB) process.

11. The method of claim 7, wherein the mixing is at a weight ratio of 80% geometric form factor and 20% resin.

12. A method for producing a magnetic resonant frequency (MRF) absorber, the method comprising:
processing a metamaterial, wherein the metamaterial is constructed from magnetic components and dielectric components having a first dielectric constant, wherein the magnetic components and dielectric components are arranged in a periodic pattern, to construct a flake geometric form factor with a 60:1 aspect ratio;
encapsulating the flake geometric form factor constructed from the metamaterial in an a Potassium Silicate ($SiO_3K_2$) matrix with a second dielectric constant at a 70% weight ratio, wherein the second dielectric constant is lower than the first dielectric constant; and
mixing the encapsulated flake geometric form factor constructed from the metamaterial with a thermosetting resin that is blended and melt-compounded at a temperature above the melting point of the resin, causing phase cancellation of reflected and emergent electromagnetic waves at frequencies based on the 60:1 aspect ratio.

13. The method of claim 12, further comprising:
mixing the encapsulated geometric form factor constructed from the metamaterial with a permeable material, wherein the permeable material is permalloy, wherein the permalloy comprises 80% nickel, 18% iron, 2% molybdenum.

14. The method of claim 12, further comprising:
introducing the mixed encapsulated geometric form factor constructed from the metamaterial to an electromagnetic brush (EMB) process.

15. The method of claim 12, wherein the mixing is at a weight ratio of 80% geometric form factor and 20% resin.

* * * * *